United States Patent [19]

Takiguchi et al.

[11] Patent Number: 4,852,116
[45] Date of Patent: Jul. 25, 1989

[54] SEMICONDUCTOR LASER DEVICE

[75] Inventors: Haruhisa Takiguchi; Shinji Kaneiwa, both of Nara; Hiroaki Kudo; Toshihiko Yoshida, both of Tenri, all of Japan

[73] Assignee: Sharp Kabushiki Kaisha, Osaka, Japan

[21] Appl. No.: 72,125

[22] Filed: Jul. 10, 1987

[30] Foreign Application Priority Data

Jul. 10, 1986 [JP] Japan .................................. 61-164150

[51] Int. Cl.⁴ .............................. H01S 3/08; H01S 3/19
[52] U.S. Cl. ........................................ 372/96; 372/45; 372/102; 357/16; 357/17
[58] Field of Search ........................... 372/45, 96, 102; 357/17, 16

[56] References Cited

U.S. PATENT DOCUMENTS

| 4,045,749 | 8/1977 | Burnham et al. | 372/96 |
| 4,178,604 | 12/1979 | Nakamur et al. | 372/96 |
| 4,704,720 | 11/1987 | Yamaguchi | 372/96 |
| 4,745,615 | 5/1988 | Kaneiwa et al. | 372/96 |
| 4,745,616 | 5/1988 | Kaneiwa et al. | 372/96 |

FOREIGN PATENT DOCUMENTS 0182508 10/1985 European Pat. Off. .
1461869 1/1977 United Kingdom .

OTHER PUBLICATIONS

Patent Abstracts of Japan; vol. 2, No. 23 (E-14); Feb. 15, 1978, pp. 11751 E 77; and JP-A-52 144 991 (Kogyo Gijutsuin) 12-2-77.

Primary Examiner—William L. Sikes
Assistant Examiner—Georgia Y. Epps
Attorney, Agent, or Firm—Birch, Stewart, Kolasch & Birch

[57] ABSTRACT

A semiconductor laser device comprising an active layer, a layer furnished with a diffraction grating and formed in the vicinity of said active layer, and another layer formed on said layer with the diffraction grating and having a refractive index smaller than that of said active layer but greater than that of said layer with the diffraction grating.

4 Claims, 3 Drawing Sheets

SEMICONDUCTOR LASER DEVICE

BACKGROUND OF THE INVENTION

The present invention relates to a distributed feedback type or distibuted Bragg reflection type semiconductor laser device which is equipped with a diffraction grating. The device performs laser oscillations at a wavelength of 660 to 890 nm in a single longitudinal mode.

When a semiconductor laser device is used as a light source in an optical information transmission system or an optical measurement system utilizing optical fibers, the laser device is required to have such operation characteristics which oscillate in a single longitudinal mode. Relative to the laser device structure suited for achieving 1 desired laser oscillation in a single longitudinal mode, a distributed feedback type device is known or distributed Bragg reflection type having a periodically corrugated diffraction grating in the active region or in the vicinity thereof.

FIG. 3 shows the structure of a conventional distributed feedback type semiconductor laser device, which comprises an n-InP substrate 10, an n-InP cladding layer (buffer layer) 20, a non-doped InGaPAs active layer 30, a p-InGaPAs optical guiding layer 40, a p-InP cladding layer 50 and a p-InGaPAs cap layer 60 formed in sequence. A p-side ohmic electrode 70 and an n-side ohmic electrode 80 are disposed on the cap layer 60 and the substrate 10 respectively, and a diffraction grating 401 for controlling the laser oscillation wavelength is formed on the upper surface of the optical guiding layer 40. This laser device employs an InGaPAs-InP semiconductor configuration with oscillation characteristics that effect laser oscillations at relatively long wavelengths of 1,300 nm. Meanwhile, a similar structure can also be applied to a semiconductor laser device for general use at shorter oscillaton wavelengths of 890 nm or less. Such a laser device comprises, as shown in FIG. 4, an n-GaAs substrate 100, an n-GaAlAs cladding layer 200, a non-doped GaAs or GaAlAs active layer 300, a p-GaAlAs optical guiding layer 400, a p-GAlAs cladding layer 500 and a p-GaAs cap layer 600 formed in sequence. In this structure, the GaAlAs cladding layer 500 is grown on a diffraction grating 401 which is formed on the GaAlAs optical guiding layer 400. However, since a crystal layer of GaAlAs or the like containing Al as a component is readily oxidized in the atmosphere to form an oxide film momentarily, regrowth of the crystal on GaAlAs is difficult to render. Consequently, with regard to laser devices operating at any oscillation wavelength shorter than 890 nm, complete requisite technology for the semiconductor lasers with a diffraction grating has not yet been practically accomplished in the present stage.

SUMMARY OF THE INVENTION

In view of the problems mentioned above, an object of the present invention is to provide an improved laser device wherein an optical guiding layer having a diffraction grating on the surface thereof is formed in the vicinity of an active layer. Another layer composted of a material greater in refractive index than the optical guiding layer but smaller than the active layer is formed on the optical guiding layer.

Another object of the present invention resides in providing an improved semiconductor laser device which is adapted to eliminate the aforementioned problems. The device is so contrived that, even though the optical guiding layer with a diffraction grating is composed of a material having a smaller refractive index in comparison with that of the active layer, light can still be sufficiently introduced to the optical guiding layer to ensure adequate feedback by the diffraction grating.

Other objects and further scope of applicability of the present invention will become apparent from the detailed description given hereinafter. It should be understood however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodiment of the present invention, the semiconductor laser device comprises an active layer, a layer with a diffraction grating formed in the vicinity of the active layer, and another layer formed on the layer with such the diffraction grating. The last mentioned layer has a refractive index smaller than that of the active layer but greater than that of the layer with the diffraction grating.

The semiconductor laser device of the present invention is designed to operate at an oscillation wavelength of 660 to 890 nm, wherein the active layer consists of $Ga_{1-x}Al_xAs$ $(0 \leq x \leq 0.4)$ or $In_{1-y}Ga_yP_{1-z}As_z$ $(0.51 \leq y \leq 1, 0 \leq z \leq 1, z=2.04y-1.04)$; the lauyer with a diffraction gradient consists of $In_{1-u}Ga_uP_{1-v}As_v$ $(v=2.04u-1.04, 0.51 < U \leq 1, 0 < V \leq 1)$ and another layer formed thereon consists of $Ga_{1-w}Al_wAs$ $(0 \leq w \leq 1.0)$ or $In_{1-k}Ga_kP_{1-l}As_l$ $(0.51 \leq k \leq 1, 0 \leq l \leq 1, l=2.04k-1.04)$. The refractive index n of the last-mentioned layer is selected to satisfy the condition $naI > n > nG$, in which $naI$ is the refractive index of the active layer, and $nG$ is that of the layer with the diffraction grating.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENT

In advance of describing the preferred embodiments of the present invention, an explanation will be first given on the structure of a known exemplary device in view of some problems existing in the conventional semiconductor laser devices, wherein an optical guiding layer forming a diffraction grating thereon consists of $In_{1-k}Ga_kP_{1-l}Asl$ (0.51≦k≦1, 0≦l≦1, l=2.04k−1.04) which is free from oxidation and enables the grating to match with GaAs. This exemplary device was proposed previously by the research group to which the present inventor belongs and was transferred later to the present applicant. The structure is disclosed in U.S. patent application, Ser No. 789,787 filed on Oct. 21, 1985, U.S. Pat. No. 4,745,615 entitled "A SEMICONDUCTOR LASER DEVICE" by Shinji KANEIWA et al. The European couterpart is Application No. 85307630.5 filed on Oct. 22, 1985.

Figure 5:
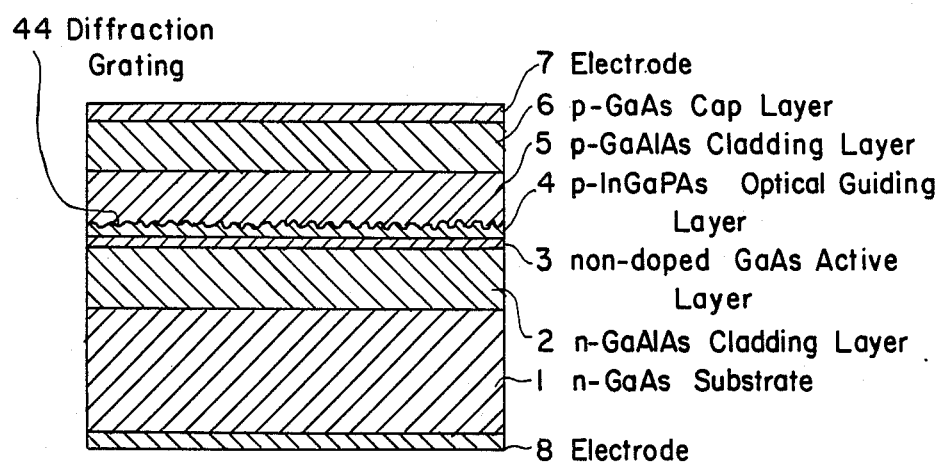
FIG. 5 is a typical sectional view showing the structure of a semiconductor laser device which fundamentally constitutes the present invention.

Now the structure of the above laser device will be described below with reference to FIG. 5. An n-GaAlAs cladding layer 2, a non-doped GaAs active layer 3 and a p-InGaPAs optical guiding layer 4 are grown successively on an n-GaAs substrate 1 by liquid phase epitaxy.

Subsequently the optical guiding layer 4 is coated with a photo-resist film, which is then subjected to an interference exposure treatment using an ultraviolet laser beam, so that a photo-resist diffraction grating 44 is formed with periodic intervals of 2500 Å. Using this diffraction grating 44 as a mask, grooves are formed on the optical guiding layer 4 by a chemical etching technique, and then the photo-resist film is removed. As a result, the desired diffraction grating 44 is formed on the optical guiding layer 4 with corrugations having a periodicity of 2500 Å. Further, on the optical guiding layer 4 having this diffraction grating 44 on its surface, a p-GaAlAs cladding layer 5 and a p-GaAs cap layer 6 are successively grown by liquid phase epitaxy in the same manner as previously mentioned, and then ohmic metal electrodes 7 and 8 are formed on the cap layer 6 and the substrate 1, respectively.

In the above laser device furnished with double-heterojunction layers constituting a multilayered crystal structure for laser operation, the active layer 3 consists of GaAs, and the cladding layers 2 and 5 consist of mixed crystals of $Ga_{1-x}Al_xAs$ in which the compound ratio x is set to be 0.2 or more. The oscillation wavelength in this example is about 890 nm. The optical guiding layer 4 consists of a quaternary mixed crystal of $In_{1-y}Ga_yP_{1-z}As_z$ in which the crystal compound ratios are selected as 0.68≦y≦1, 0.34≦z≦1, z=2.04y−1.04. Meanwhile, the forbidden band width and the refractive index of the optical guiding layer 4 are set between the forbidden band width and the refractive index of the active layer 3 and the cladding layer 5. For achieving oscillation wavelengths of 890 nm or less, the compositions of the active layer 3 and the cladding layers 2 and 5 may be modified so that, besides the above example, the active layer 3 is composed of $Ga_{1-x}Al_xAs$ with its crystal compound ratiio x selected in a range of 0≦x≦0.4, while the cladding layers 2 and 5 are composed of $Ga_{1-x}Al_xAs$ with its compound ratio x selected in a range of 0.2≦x≦1 which is higher than that of the active layer 3 to render the band gap energy thereof greater than that of the active layer 3 by 0.3 eV or more. Due to selective settings of the crystal compound ratios in the proper ranges mentioned above, the laser device obtained has an oscillation wavelength of 660 to 890 nm. For setting the oscillation wavelength within such 1 range, the active layer 3 may be composed of $In_{1-y}Ga_yP_{1-z}As_z$, instead of the aforesaid material GaAs-GaAlAs, with the individual crystal compound ratios being selected as 0.51≦y≦1, 0≦z≦1 and z=2.04y−1.04. Furthermore, the cladding layers 2 and 5 may be composed of $In_{1-y}Ga_yP_{1-z}As_z$ with the individual crystal compound ratios being selected as 0.51≦y≦0.81, 0≦z≦0.6 and z=2.04y−1.04. Regarding the optical guiding layer 4, a quaternary mixed crystal of $In_{1-y}Ga_yP_{1-z}As_z$ (where z=2.04y−1.04) is employed instead of GaAlAs so as to avert oxidation of Al Crystal compound ratios of the original guiding layer 4 are determined by properly selecting the materials of both the active layer 3 and the cladding layers 2 and 5.

Since InGaPAs is used for the optical guiding layer 4 in the above structure, its surface is not oxidized in the subsequent steps of photo etching and so forth to form a diffraction grating. Therefore the succeeding regrowth is executed with a facility towards consequently accomplishing a high-quality distributed feedback laser device with satisfactory reproducibility. However, the semiconductor laser device mentioned hereinabove still has the following disadvantages. An unstable mixed region existing in a mixed crystal of InGaAs grating-matched with GaAs is known. With regard to such unstable an mixed region, a detailed description is given in, for example, Kentaro Onabe, "Applied Physics", Vol. 53, p. 802 (1984). At a general growth temperature of 800° C. for the semiconductor laser device shown in FIG. 5, it is difficult, due to the existence of such an unstable mixed region, to attain proper growth of the InGaAs layer composed of $In_{1-k}Ga_kP_{1-l}Asl$ (where 0.64≦k≦0.72, 0.27≦l≦0.43) with the forbidden band width ranging from 1.77 to 1.68 eV. Although the InGaPAs layer in the vicinity of such a composition is allowed to grow to some extent, crystalline properties of the layer do no satisfactory include a low intensity of the photo luminescence and a large half width of the spectrum.

It is therefore requisite for the guiding layer to consist of $In_{0.49}Ga_{0.51}P$ which has the highest crstalline quality out of mixed crystals of InGaPAs to be grating-matched with GaAs. In the visible-ray semiconductor laser of $Ga_{1-x}Al_xAs$ system, the most reliable active layer consists of $Ga_{0.87}Al_{0.13}As$ which achieves an oscillation wavelength of 780 nm. In constituting a distributed feedback semiconductor laser of such an oscillation wavelenth, the respective thicknesses of the active layer, optical guiding layer and cladding layers need to be determined on the basis of the individual refractive indexes thereof. In such 1 determination, it is necessary to contrive that a great change is induced in the equivalent refractive index by the diffraction grating and a sufficient amount of light is introduced toward the guiding layer to effect feedback. However, in the active layer of AlGaAs where the Al compound ratio x is 0.13, the refractive index at an oscillation wavelength of 780 nm is 3.56. Meanwhile, in the case of using $In_{0.49}Ga_{0.51}P$ for the optical guiding layer, the refractive index thereof is 3.37. Accordingly, the difference between the refractive index of the active layer and that of the guiding layer becomes excessively great to consequently impede 1n adequate leakage of the light from the active layer toward the optical guiding layer, whereby a problem is raised that sufficient feedback fails to be effected by the diffraction grating.

In an attempt to solve the problem relative to such feedback, the present inventor has developed an improved laser device structure on the basis of the semiconductor laser device mentioned hereinabove.

Figure 1:
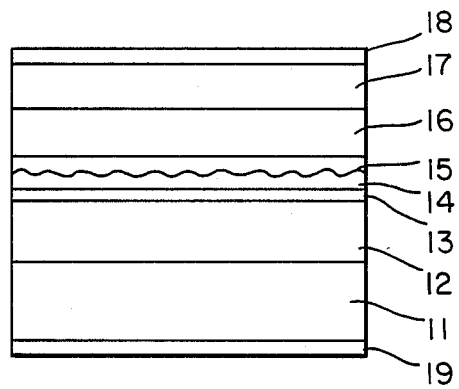
FIG. 1 is a typical sectional view of a distributed feedback semiconductor laser device embodying the present invention.

FIG. 1 shows the structure of a preferred embodiment of the present invention. On an nGaAs substrate 11, an n−$Ga_{0.5}Al_{0.5}As$ cladding layer 12 for shutting light in, a non-doped $Ga_{0.89}Al$ active layer 13 for causing laser oscillation, and a $P-In_{0.49}Ga_{0.51}P$ optical guiding layer 14 for forming a diffraction grating thereon are successively formed by epitaxial growth. In this structure, the optical guiding layer 14 is composed of a ternary mixed crystal with a greater forbidden band width and a smaller refractive index than the active layer 13. Subsequently a diffraction grating is shaped on the optical guiding layer 14 by the same process as in the prior art. First the optical guiding layer 14 is coated with a photo-resist film, which is then subjected to an interference exposure treatment using an ultraviolet laser beam, so that a photo-resist diffraction grating is formed with periodic intervals of 2500 Å. Using this diffraction grating when used as a mask, grooves are formed on the optical guiding layer 14 by a chemical etching technique, and then the photo-resist film is removed. As a result, a desired diffraction grating with corrugations having a periodicity of 2500 Å is formed on the optical guiding layer 14. Further, on the optical guiding layer 14 having such as diffraction grating on its surface, a $p-Ga_{0.75}Al_{0.25}As$ intermediate layer 15, a $p-Ga_{0.5}Al_{0.5}As$ cladding layer 16, and a cap layer 17 for ohmic contact with electrodes are successively formed by epitaxial growth. Subsequently, ohmic metal electrodes 18 and 19 are formed on the cap layer 17 and the reverse surface of the substrate 11, respectively. Thus, a semiconductor laser device that operates at an oscillation wavelength of 780 nm is produced. The oscillation wavelength can be selectively changed as desired by controlling the crystal compound ratio of Al in the active layer 13.

In this exemplary embodiment, the intermediate layer 15 is composed on InGaPAs which is grating-matched with the substrate of GaAlAs or GaAs where the crystal compound ratio is selected to obtain a relationship of $n_G < n < n_{AL}$, in which $n$, $n_{AL}$ and $n_G$ are the refractive indexes of the intermediate layer 15, the active layer 13 and the optical guiding layer 14 with the diffraction grating formed thereon, respectively. In the above embodiment, the intermediate layer 15 consists of GaAlAs where the compound ratio of Al is 0.25.

Figure 2:
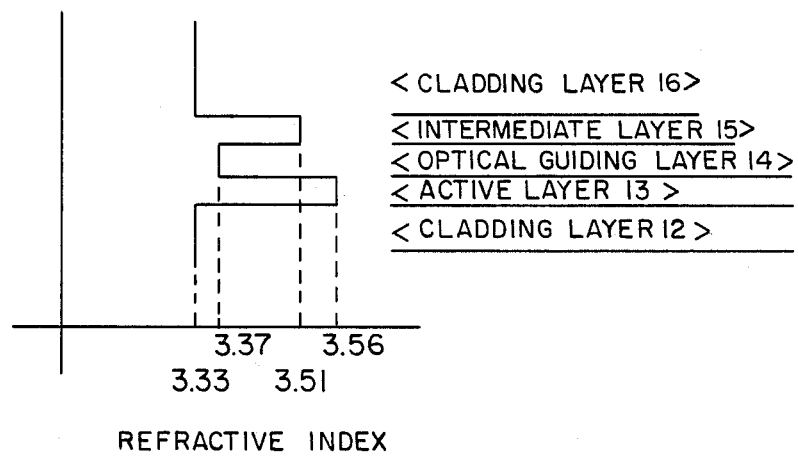
FIG. 2 illustrates the distribution of refractive indexes in the direction of thickness of the semiconductor laser device shown in FIG. 1.
Figure 3:
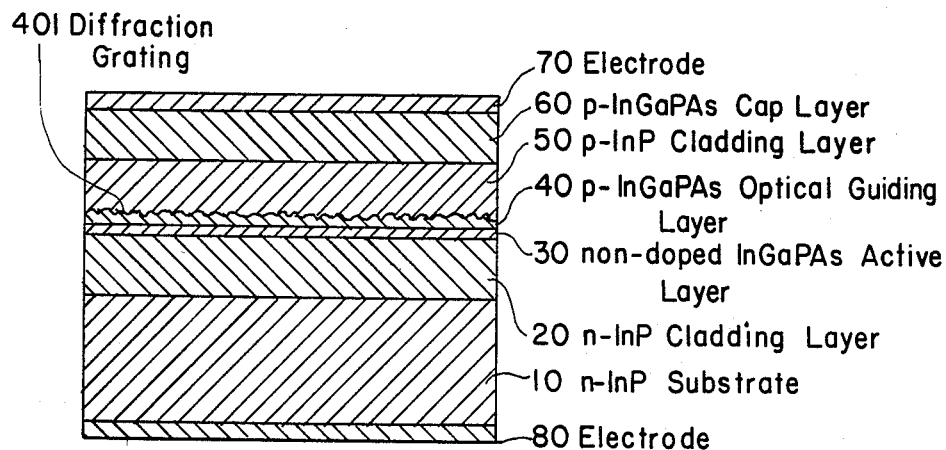
FIGS. 3 and 4 are typical sectional views showing the structure of conventional semiconductor laser devices.
Figure 4:
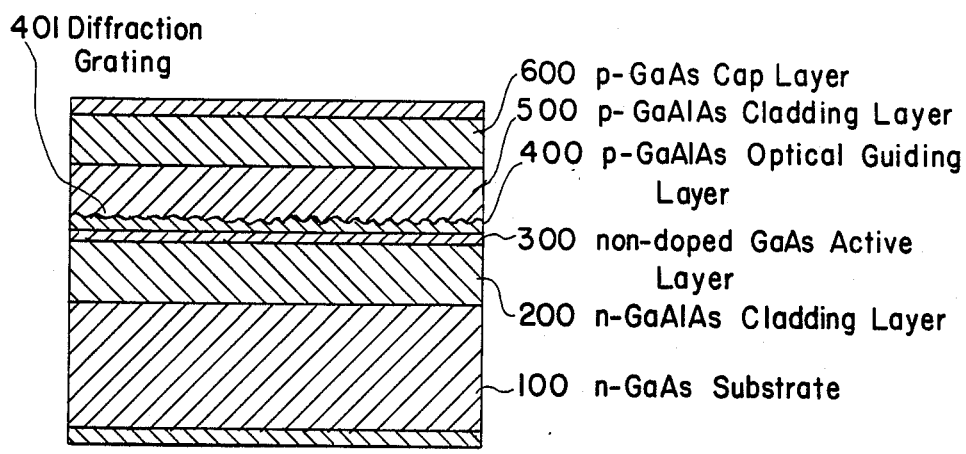

FIG. 2 shows changes of the individual refractive indexes in the thickness direction of each layer in the semiconductor laser device of the above embodiment. Due to the insertion of the intermediate layer 15, the light from the active layer 13 is led out toward the intermediate layer 15 having a small refractive index difference and the light is caused to leak out thereto, so that the optical density of the optical guiding layer 14 having a great refractive index difference is rendered high. As a result, leakage of the light is induced toward the optical guiding layer 14. Consequently, a large amount of the light furnished by wavelength selectivity of the diffraction grating of the optical guiding layer 14 is fed back to the active layer 13, whereby laser oscillation is attained at a single wavelength. It is to be understood here that the present invention is not limited to the distributed feedback type laser device alone and is applicable also to a distributed Bragg reflection type laser device as well.

The semiconductor laser device according to the present invention is fabricated so that an intermediate layer having a high refractive index is provided on the reverse side, with respect to the active layer, of the optical guiding layer with a diffraction grating formed thereon. The refractive index $n$ of the intermediate layer is selected to be within a range of $n_G < n < n_{AL}$, where $n_{AL}$ and $n_G$ are respectively the refractive indexes of the active layer and the optical guiding layer. These layers are sequentially superposed in the order of the active layer, the optical guiding layer and the layer having a refractive index $n$, wherein the light from the active layer is led out by the layer of a refractive index $n$ so that the optical density of the guiding layer disposed therebetween is rendered high.

As described in detail hereinabove, according to the semiconductor laser device of the present invention equipped with a diffraction grating and an optical guiding layer having a minimum refractive index in comparison with that of the active layer, light can be sufficiently introduced to the optical guiding layer to consequently ensure adequate feedback by the diffraction grating.

The laser device of the present invention is produced so that a desired oscillation wavelength can be obtained within a range of 660 to 890 nm. The active layer consists of $Ga_{1-x}Al_xAs$ (where $0 \leq x \leq 0.4$) or $In_{1-y}Ga_yP_{1-z}As_z$ (where $0.51 \leq y \leq 1$, $0 \leq z \leq 1$, $z = 2.04y - 1.04$); the optical guiding layer with a diffraction grating consists of $In_{1-u}Ga_uP_{1-v}As_v$ (where $v = 2.04u - 1.04$,) and the layer formed on the optical guiding layer with a diffraction grating consists of $Ga_{1-w}Al_wAs$ (where $0 \leq w \leq 1.0$) or $In_{1-k}Ga_kP_{1-l}As_l$ (where $0.51 \leq k \leq 1$, $0 \leq l \leq 1$, $l = 2.04k - 1.04$). The refractive index $n$ of the last-mentioned layer is set so as to satisfy a condition of $nal > n > n_G$, in which $nal$ and $n_G$ are the refractive indexes of the active layer and the optical guiding layer with the diffraction grating, respectively.

While only certain embodiments of the present invention have been described, it will be apparent to those skilled in the art that various changes and modifications may be made therein without departing from the spirit and scope of the present invention as claimed.

What is claimed is:

1. In a structure for a semiconductor laser device providing laser oscillation in a single longitudinal mode comprising:

an active layer for emitting light and being formed of $Ga_{1-x}Al_xAs$, where $0 \leq x \leq 0.4$, or $In_{1-y}Ga_yP_{1-z}As_z$, where $0.51 \leq y \leq 1$, $0 \leq z \leq 1$ and $z = 2.04Y - 1.04$, said active layer having a first refractive index value;

an optical guiding layer for receiving light from said active layer, said optical guiding layer having a bottom surface disposed above said acitve layer and being formed of $In_{1-u}Ga_uP_{1-v}As_v$, where $v = 2.04u - 1.04$, $0.51 < u \leq 1$ and $0 < v \leq 1$, and having a second refractive index value so that said first refractive index value is greater than said second refractive index value;

a diffraction grating formed in a top surface of said optical guiding layer opposite to said bottom surface for feeding back light to control the oscillation of the semiconductor laser device; and an intermediate layer for inducing transfer of light towards said optical guiding layer and being formed of $Ga_{1-w}Al_wAs$, where $0 \leq w \leq 1.0$ or $In_{1-k}Ga_kP_{1-l}As_l$, where $0.51 \leq k \leq 1$, $0 \leq l \leq 1$ and $2.40k - 1.04$, said intermediate layer being disposed above said diffraction grating layer and having a third refractive index value greater than said second refractive index value and less than said first refractive index value.

2. In the structure as defined in claim 1, wherein said diffraction grating layer is formed of corrugations having a periodicity of 2500 Å.

3. In a structure for a semiconductor device providing laser oscillation in a single longitudinal mode and oscillating at a wavelength between the values of 660 nm and 890 nm comprising:

an active layer for emitting light and being formed of $Ga_{1-x}Al_xAs$, where $0 \leq x \leq 0.4$ or $In_{1-y}Ga_yP_{1-z}As_z$, where $0.51 \leq y \leq 1$, $0 \leq z \leq 1$ and $z = 2.04y - 1.04$, said active layer having a first refractive index value;

an optical guiding layer for receiving light from said active layer, said optical guiding layer having a bottom surface disposed above said active layer and being formed of $In_{1-u}Ga_uP_{1-v}As_v$, where $v = 2.04u - 1.04$, $0.51 \leq u \leq 1$ and $0 \leq v \leq 1$, and having a second refractive index value so that said first refractive index value is greater than said second refractive index value;

a diffraction grating layer formed in a top surface of said optical guiding layer opposite to said bottom surface for feeding back light to control the oscillation of the semiconductor laser device; and an intermediate layer for inducing light towards said optical guiding layer and being formed of $Ga_{1-w}Al_2As$, where $0 \leq w \leq 1.0$ or $In_{1-k}Ga_kP_{1-l}As_l$, where $0.51 \leq k \leq 1$, $0 \leq l \leq 1$ and $l = 2.04k \leq 1.04$, said intermediate layer being disposed above said diffraction grating layer and having a third refractive index value greater than said second refractive index value and less than said first refractive index value.

4. In the structure as defined in claim 3, wherein said diffraction grating layer is formed of corrugations having a periodicity of 2500 Å.

* * * * *